(12) United States Patent
Fujita (10) Patent No.: US 8,106,681 B2
(45) Date of Patent: Jan. 31, 2012

(54) SEMICONDUCTOR DEVICE, AND PROGRAMMING METHOD AND PROGRAMMING SYSTEM THEREFOR

(75) Inventor: Tadashi Fujita, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 0 days.

(21) Appl. No.: 12/591,015

(22) Filed: Nov. 4, 2009

(65) Prior Publication Data

US 2010/0117680 A1 May 13, 2010

(30) Foreign Application Priority Data

Nov. 7, 2008 (JP) ................................. 2008-286985

(51) Int. Cl.
*H03K 19/173* (2006.01)
(52) U.S. Cl. ........................................................ 326/38
(58) Field of Classification Search .............. 326/37–41, 326/47, 101
See application file for complete search history.

(56) References Cited

U.S. PATENT DOCUMENTS

| 5,946,219 A | 8/1999 | Mason et al. | |
|---|---|---|---|
| 7,099,818 B1* | 8/2006 | Nemecek et al. | 703/28 |
| 2009/0083460 A1* | 3/2009 | Mitra et al. | 710/104 |

FOREIGN PATENT DOCUMENTS

JP 2001-504958 A 4/2001

* cited by examiner

*Primary Examiner* — Shawki S Ismail
*Assistant Examiner* — Thienvu Tran
(74) *Attorney, Agent, or Firm* — McGinn Intellectual Property Law Group, PLLC (57) ABSTRACT

In a method of programming a differential programming semiconductor device, first identification data corresponding to first program data is outputted from an ID register of a program circuit in the device to a host. The first program data is programmed in a plurality of interconnections. The first program data is read from a storage unit based on the first identification data. Write data is generated based on the first program data and a second program data, which is to be newly programmed in the plurality of interconnections. The write data is transferred from the host to the device. The write data is written in the plurality of interconnections by the program circuit so as to program the second program data in the plurality of interconnections.

11 Claims, 11 Drawing Sheets

SEMICONDUCTOR DEVICE, AND PROGRAMMING METHOD AND PROGRAMMING SYSTEM THEREFOR

INCORPORATION BY REFERENCE

This patent application claims a priority on convention based on Japanese Patent Application No. 2008-286985. The disclosure thereof is incorporated herein by reference.

BACKGROUND OF THE INVENTION

1. Field of the Invention

The present invention relates to a semiconductor device, and more particularly to a semiconductor device that functions as a differential programmable device, a programming method and programming system therefore.

2. Description of Related Art

Figure 1:
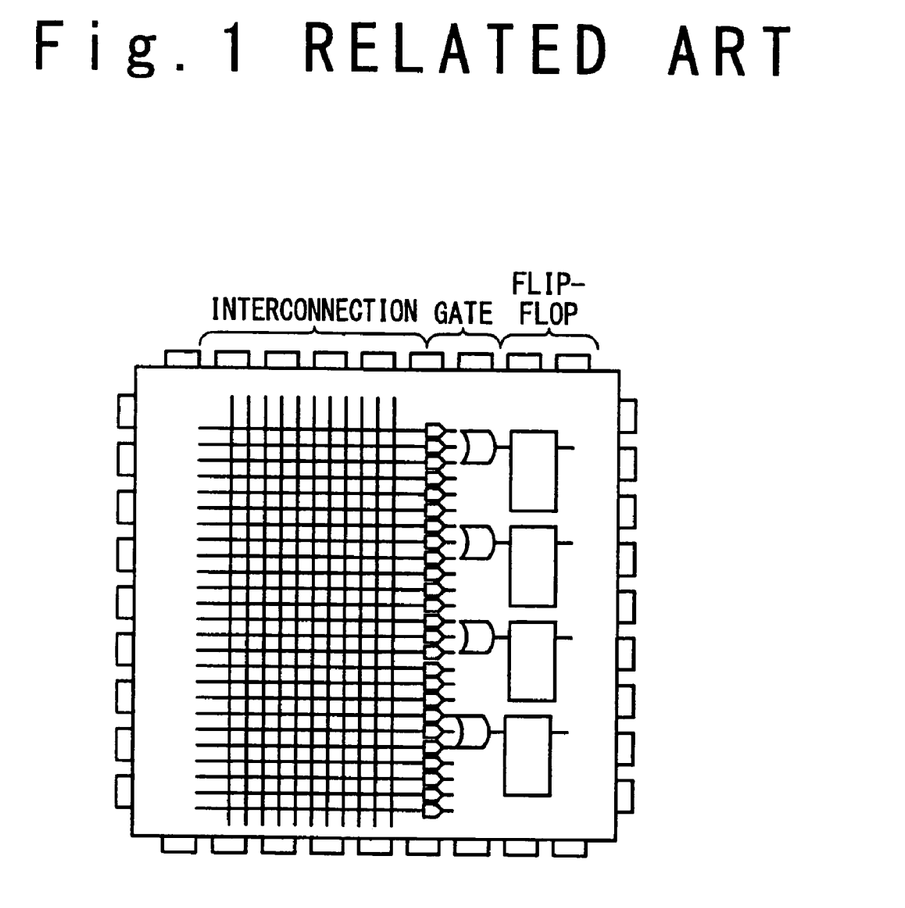
FIG. 1 is a diagram illustrating a structure of a conventional CPLD (Complex Programmable Logic Device)

FIG. 1 is an example of a structure of a typical CPLD (Complex Programmable Logic Device). In such a CPLD, the device is programmed by connecting/disconnecting interconnections (VIA). The interconnections are nonvolatile. Also, upon re-programming, the device is initialized and rewritten. In this case, there is almost no difference in programming time between a first programming and a second or a subsequent programming.

In conjunction with the above technique, a method of configuring a logic device array is disclosed in Japanese Patent Application Publication (JP 2001-504958A: first conventional example). In this first conventional example, under the assumption that a state of a device is always controlled and recognized by a host, a design database is generated by arranging and routing a logic circuit. The design database is accessed to edit the configuration of a logic cell generated by the arrangement and routing operations. On the basis of the edition, a partial configuration bit stream including only a bit string is generated to achieve the edited logic cell. The partial configuration bit stream is downloaded to a gate array. This allows the gate array to be partially configured. In an alternative example, a system according to this first conventional example includes a software utility that an application program is executed in a system including a programmable gate array to permit an on-the-fly array to be re-configured. The utility includes a routine in which a design is edited in response to an external situation detected during an actual time. This approach eliminates the necessity to provide the predetermined alternative design, and allows an application to make a determination by itself.

Figure 2:
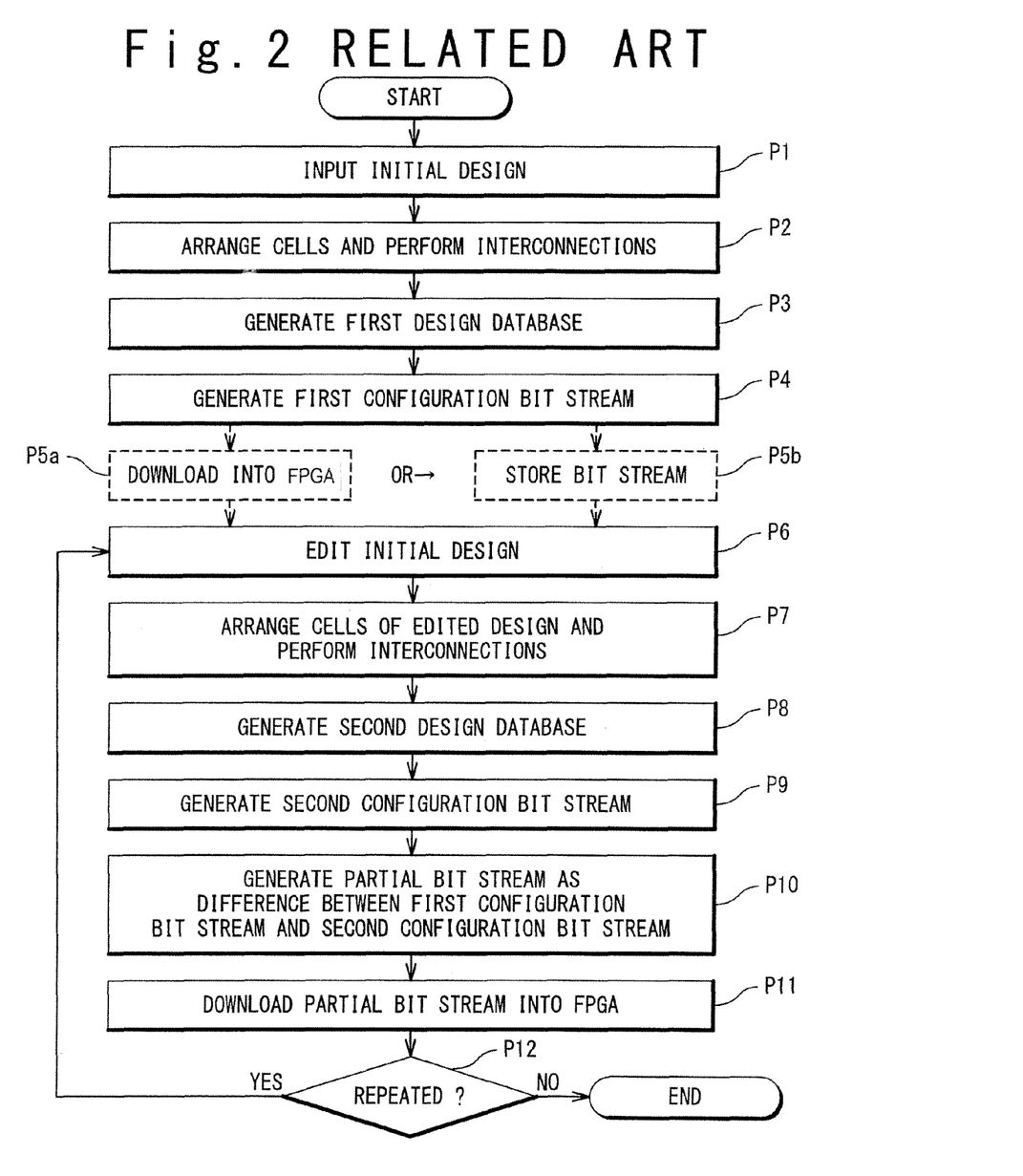
FIG. 2 is a diagram illustrating a process procedure in a conventional differential programming method.

FIG. 2 is an example of a procedure in a conventional operation method of the device. In this example, the assumption is that the device state has been already known.

In this operation method, an initial design is inputted (Step P1). Then, on the basis of the inputted initial design, arrangement and routing of a logic circuit are performed (Step P2), and on the basis of a performing result, a first design database is generated (Step P3), and a first configuration bit stream is generated (Step P4). At this time, the first configuration bit stream is downloaded (Step P5a) or stored in a FPGA (Field Programmable Gate Array) (Step P5b). In the case where the initial design is edited (Step P6), the arrangement and routing of the logic circuit are performed on the basis of the edited initial design (Step P7). On the basis of a performing result, a second design database is generated (Step P8), and a second configuration bit stream is generated (Step P9). Then, as a difference between the first and second configuration bit streams, a partial bit stream is generated (Step P10). At this time, the partial bit stream may be adapted to be downloaded to the FPGA (Step P11). Whether or not the partial bit stream is downloaded to the FPGA is optional. If the initial design is further edited, the above-described edition is repeated (Step P12).

However, in a highly integrated programmable device, the number of interconnections increases, and therefore a programming time increases. An estimate of the programming time is preferably measured on the order of msec (milliseconds). In particular, if it takes a long time to program one of the interconnections, the above problem becomes obvious.

The method of differential programming in FIG. 2 cannot be used for a case where a state of a device is unknown, or devices in a plurality of states are mixed.

SUMMARY OF THE INVENTION

In an aspect of the present invention, a method of programming a differential programming semiconductor device, is achieved: by outputting first identification data corresponding to first program data from an ID register of a program circuit in the device to a host, wherein the first program data is programmed in a plurality of interconnections; by reading the first program data from a storage unit by the host based on the first identification data; by generating write data based on the first program data and a second program data, which is to be newly programmed in the plurality of interconnections, by the host; by transferring the write data from the host to the device; and by writing the write data in the plurality of interconnections by the program circuit so as to program the second program data in the plurality of interconnections.

In another aspect of the present invention, a programming system includes: a differential programming semiconductor device which includes: a plurality of interconnections in which program data is programmed, and a program circuit which comprises an ID register configured to hold identification data corresponding to the programmed program data, and which programs the program data in the plurality of interconnections. The programming system further includes a storage unit configured to store program data; and a host configured to read first identification data corresponding to first program data from the ID register of the program circuit, read the first program data from the storage unit based on the first identification data, generate write data based on the first program data and a second program data, which is to be newly programmed in the plurality of interconnections, and transfer the write data to the program circuit. The first program data has been programmed in the plurality of interconnections. The program circuit writes the write data in the plurality of interconnections so as to program the second program data in the plurality of interconnections.

In still another aspect of the present invention, a semiconductor device, which functions as a differential programmable device, includes: a plurality of interconnections, each of which is set to a connection state or a disconnection state; and a program circuit which comprises an ID register configured to hold program identification data of program data programmed in the plurality of interconnections, and which receives the program data and programs the plurality of interconnections based on the received program data.

The present invention can shorten a programming time without controlling a state of a device.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE EMBODIMENTS

Hereinafter, a semiconductor device of the present invention will be described with reference to the attached drawings.

Figure 3:
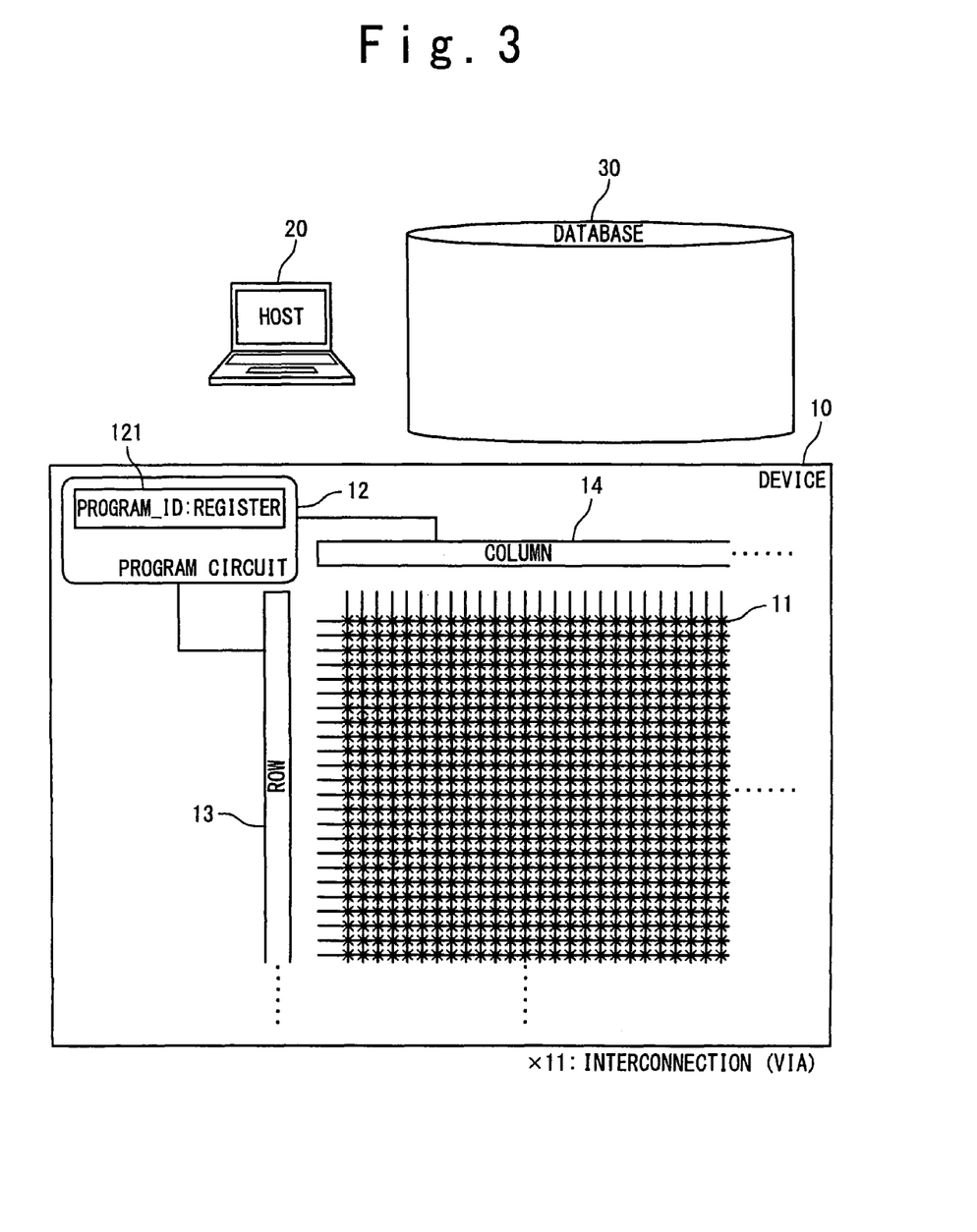
FIG. 3 is a diagram illustrating a configuration of a programmable logic device (PLD) according to an embodiment of the present invention.

FIG. 3 illustrates a programming system including a programmable logic device (PLD). The programming system according to the present invention includes a device 10, a host 20, and a database 30. The programmable logic device (PLD) is assumed to be a semiconductor device functioning as a differential programmable device.

The device 10 includes interconnections (VIA) 11, a program circuit 12, a first logic circuit (ROW) 13, and a second logic circuit (COLUMN) 14.

The interconnections 11 are nonvolatile. The interconnections 11 have a longer connection/disconnection time. The connection/disconnection time is assumed to be 1 msec or more. Also, the number of the interconnections is assumed to be 1 M (million) or more.

The program circuit 12 connects/disconnects each of the interconnections 11 through the first and second logic circuits 13 and 14. The program circuit 12 has a PROGRAM_ID register 121. The PROGRAM_ID register 121 holds a "PROGRAM_ID". The "PROGRAM_ID" is identification data that is different depending on the number of times of execution of a program. For example, the "PROGRAM_ID" is different between first and second executions. In addition, the PROGRAM_ID register 121 is externally readable. As an example of the program circuit 12, a control circuit (Controller) is possible.

The first logic circuit 13 supplies a signal in a row direction of a matrix that is formed by a group of the interconnections 11. In this case, the first logic circuit 13 is controlled by the program circuit 12. As an example of the first logic circuit 13, a word line drive circuit is possible. The second logic circuit 14 supplies a signal in a column direction of the matrix that is formed by the group of the interconnections 11. In this case, the second logic circuit 14 is controlled by the program circuit 12. As an example of the second logic circuit 14, a bit line drive circuit is possible.

The host 20 executes a program for the device 10. Also, every time executing the program, the host 20 generates "PROGRAM_DATA (program data)" and "PROGRAM_ID (identification data). The "PROGRAM_DATA" is data directly or indirectly indicating states of the interconnections 11. It should be noted that the host 20 may be unable to directly read the states of the interconnections 11. Upon the last execution of the program, the host 20 generates "PROGRAM_DATA" corresponding to a "PROGRAM_ID", and stores the "PROGRAM_ID" in the PROGRAM_ID register 121. Upon the next execution of the program, the host 20 reads the "PROGRAM_ID" from the PROGRAM_ID register, and determines the states of the interconnections 11 on the basis of the "PROGRAM_DATA" corresponding to the "PROGRAM_ID". As an example of the host 20, a computer such as a PC (personal computer), a thin client terminal/server, a workstation, a mainframe, or a supercomputer is considered.

The database 30 stores data received from the host 20, and supplies the stored data to the host 20. In this case, the database 30 stores "PROGRAM_DATA" and "PROGRAM_ID", which are related to each other. It should be noted that the database 30 may be shared by a plurality of hosts 20. Also, the database 30 may be an RDB (Relational DataBase). As an example of the database 30, a semiconductor memory device such as a memory, an external storage device (storage) such as a hard disk, and a recording medium (medium) are possible. Also, the database 30 may be an external storage server connected to the host 20 through a network, or a peripheral device of the host 20. However, in practice, there is no limitation to such examples.

Figure 4:
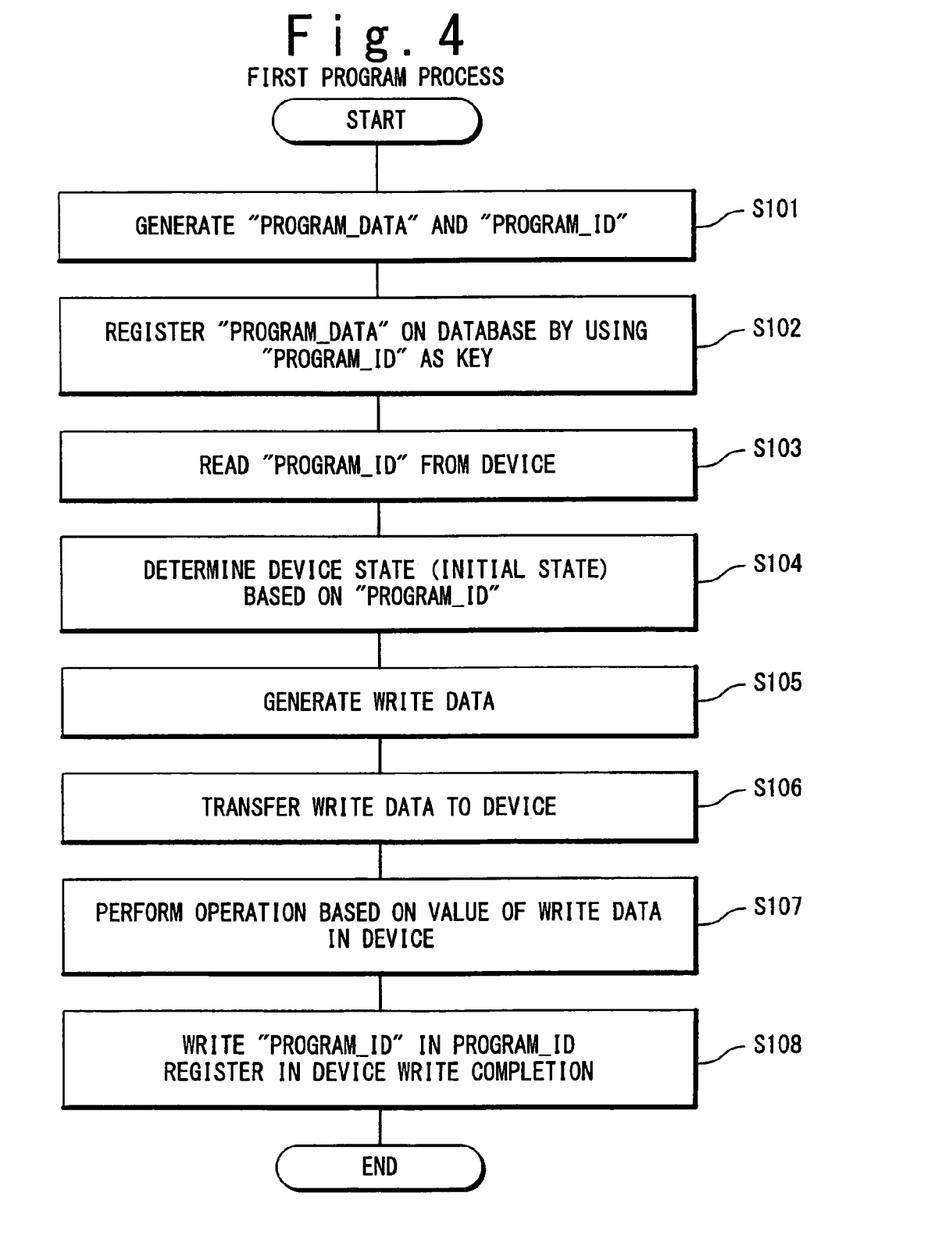
FIG. 4 is a flowchart illustrating a first programming process in the embodiment.

Referring to FIG. 4, a first programming process flow will be described. In this example, the interconnections 11 in the device 10 are all in a DISCONNECTED (disconnection) state. Also, it is assumed that the PROGRAM_ID register 121 is a "16-bit" register, of which an initial state is represented by "0000". That is, an initial value of the "PROGRAM_ID" is "0000". In addition, a range of possible values of the "PROGRAM_ID" is "0000"-"FFFF".

(1) Step S101

Figure 5:
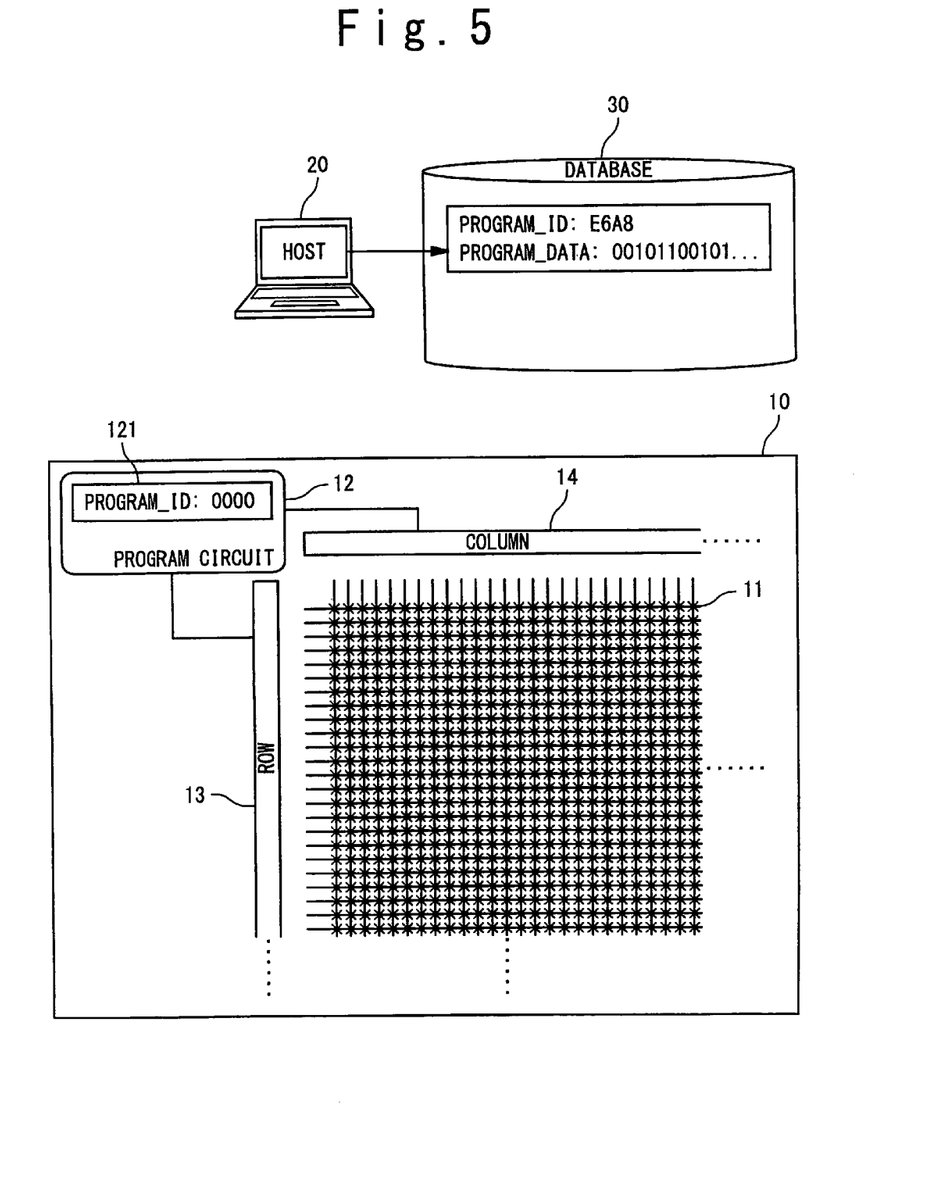
FIG. 5 is a diagram illustrating registration of program data in a database in the first programming process in the embodiment.

As illustrated in FIG. 5, the host 20 generates "PROGRAM_DATA" and "PROGRAM_ID". It is assumed that a "PROGRAM_ID" is unique. In this example, the "PROGRAM_ID" is assumed as "PROGRAM_ID=E6A8"

(2) Step S102

The host 20 uses the "PROGRAM_ID" as a key to register the "PROGRAM_DATA" in the database 30.

(3) Step S103

Figure 6:
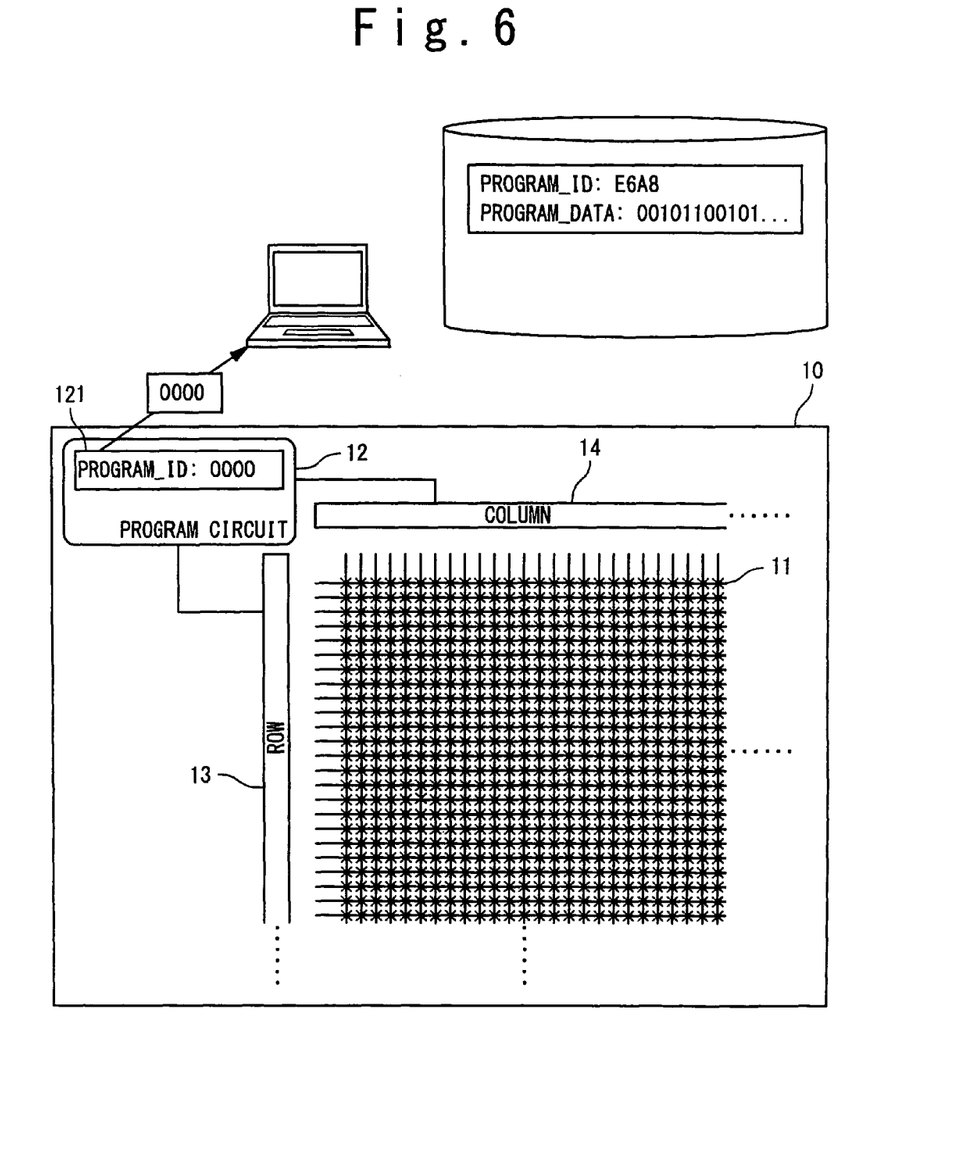
FIG. 6 is a diagram illustrating read of a PROGRAM_ID in the first programming process.

As illustrated in FIG. 6, the host 20 reads a "PROGRAM_ID" from the PROGRAM_ID register 121 in the device 10. That is, the host 20 inquires the "PROGRAM_ID" held in the PROGRAM_ID register 121 to the device 10. In this case, because of an initial state, the device 10 returns the initial value "0000" of the "PROGRAM_ID" to the host 20.

(4) Step S104

The host 20 determines a state of the device 10, i.e., a state of each of the interconnections 11 of the device 10, on the basis of the "PROGRAM_ID". In this case, upon receipt of the initial value "0000" of the "PROGRAM_ID", the host 20 determines that the device 10 is in the initial state, i.e., the interconnections 11 of the device 10 are all in the "DISCONNECT" state.

(5) Step S105

Figure 7:
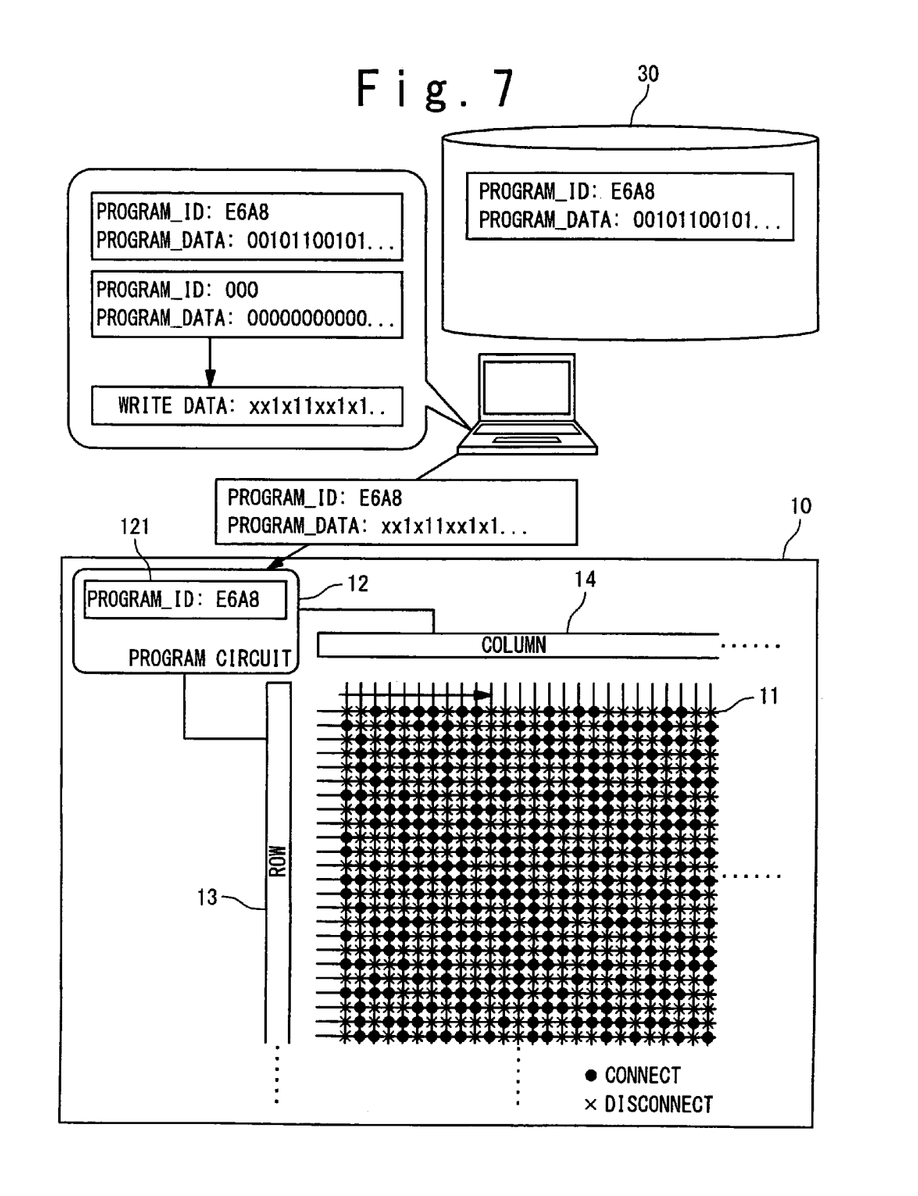
FIG. 7 is a diagram illustrating of transfer of write DATA to the device in the first programming process.

As illustrated in FIG. 7, the host 20 generates write DATA on the basis of the state of the device 10. At this time, the host 20 determines and recognizes that the device 10 is in the initial state, and therefore assumes that all values of "DEVICE_DATA" indicating the states of the interconnections 11 of the device 10 are "0" ("0=DISCONNECT"), and generates the write DATA under the assumption. Thus, the values of "DEVICE_DATA" are all represented by "0". In this way, the host 20 regards "PROGRAM_DATA" generated upon the last execution of the programming as "DEVICE_DATA". If the device 10 is in the initial state, there is no "PROGRAM_DATA" generated last, and therefore the values of "DEVICE_DATA" are all regarded as "0". At this time, the host 20 may register in the database 30, all the values of "PROGRAM_DATA" corresponding to "PROGRAM_ID=0000" as "0" in advance. In addition, a write operation is unnecessary in a case of "0=DISCONNECT", and therefore the host 20 replaces the values of the write DATA, i.e., "0=DISCONNECT", by "x=NO_OPERATION". That is, the values of the write DATA are all represented by x. Here, the write DATA indicates data to be changed from the current "DEVICE_DATA" (i.e., a difference in "PROGRAM_DATA (program data)"). In the write DATA, data values not to be changed from the current "DEVICE_DATA" are all "x=NO_OPERATION". For example, when the current "DEVICE_DATA" is desirably changed from "0000" to "0001", the write DATA will be "xxx1".

(6) Step S106

The host 20 transfers the write DATA to the device 10.

(7) Step S107

The program circuit 12 of the device 10 performs any of operations of "CONNECT (wiring)", "DISCONNECT (non-wiring)", and "NO_OPERATION (no operation)" according to each of the values of the write DATA. It should be noted that if "x=NO_OPERATION", the host 20 skips without doing anything.

(8) Step S108

Upon completion of the write operation of the write DATA into the device 10, the host 20 writes the "PROGRAM_ID" in the PROGRAM_ID register 121. In this case, upon completion of the transfer of the write DATA to the device 10, the host 20 transfers "E6A8" to the program circuit 12 of the device 10 as a data of the "PROGRAM_ID". The program circuit 12 writes "E6A8", which is transferred from the host 20 and represents the "PROGRAM_ID", in the PROGRAM_ID register 121.

Figure 8:
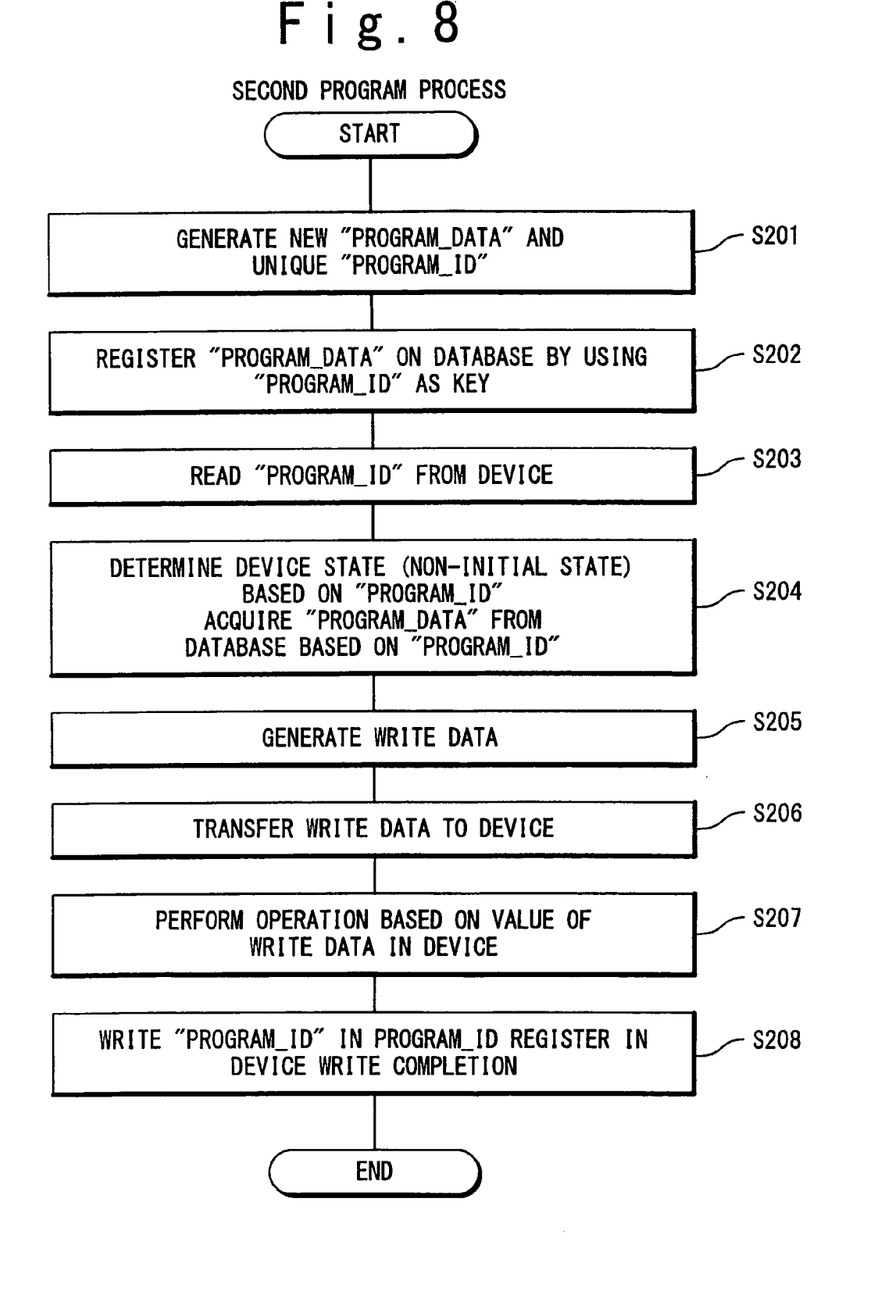
FIG. 8 is a flowchart illustrating a second or subsequent programming process.

Referring to FIG. 8, a second or subsequent programming process will be described.

(1) Step S201

Figure 9:
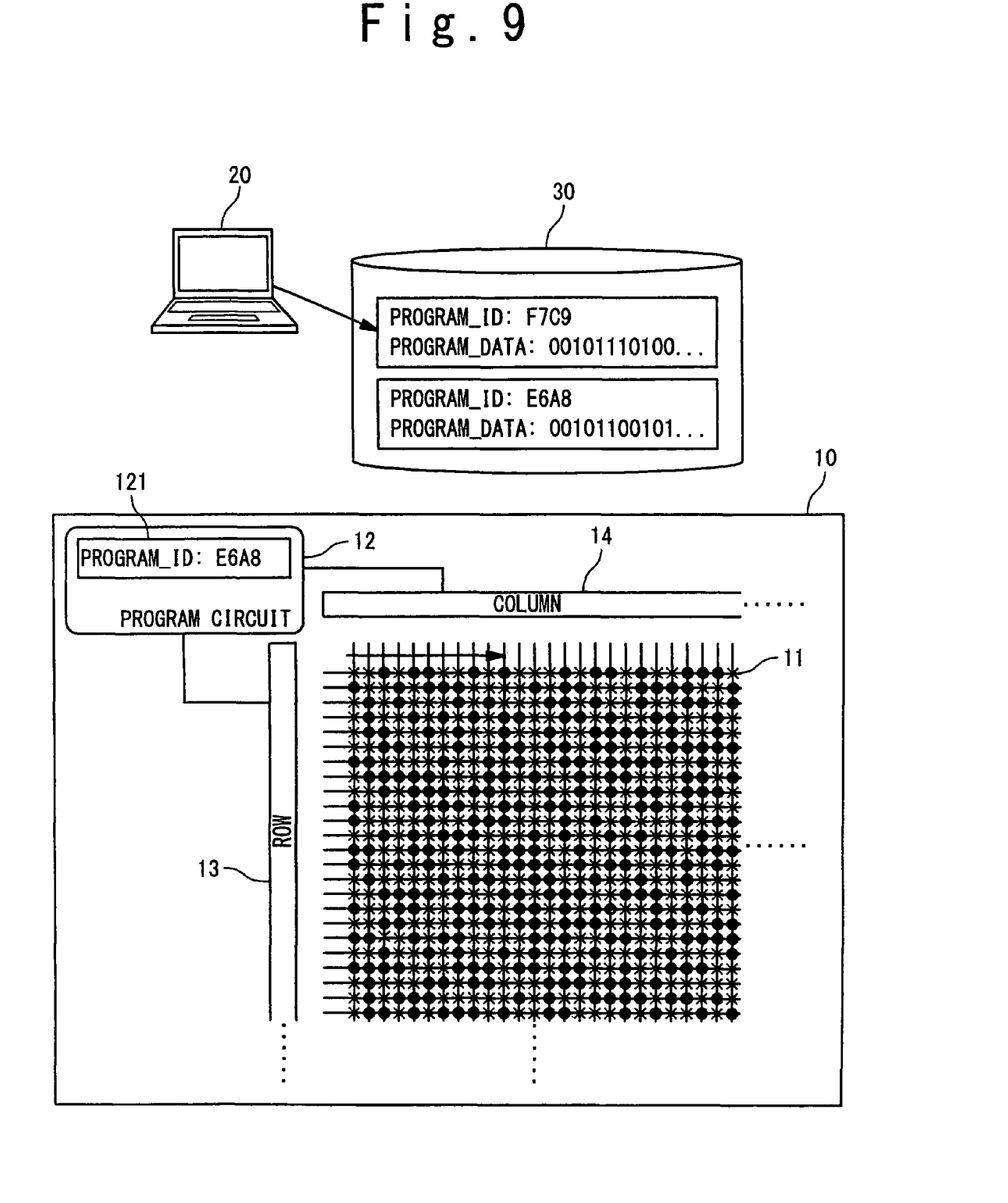
FIG. 9 is a diagram illustrating registration of program data in a database in the second or subsequent programming process.

As illustrated in FIG. 9, the host 20 generates a new "PROGRAM_DATA" and a unique "PROGRAM_ID". In this example, "PROGRAM_ID=F7C9" is assumed.

(2) Step S202

The host 20 uses the "PROGRAM_ID" as a key to register the "PROGRAM_DATA" in the database 30.

(3) Step S302

Figure 10:
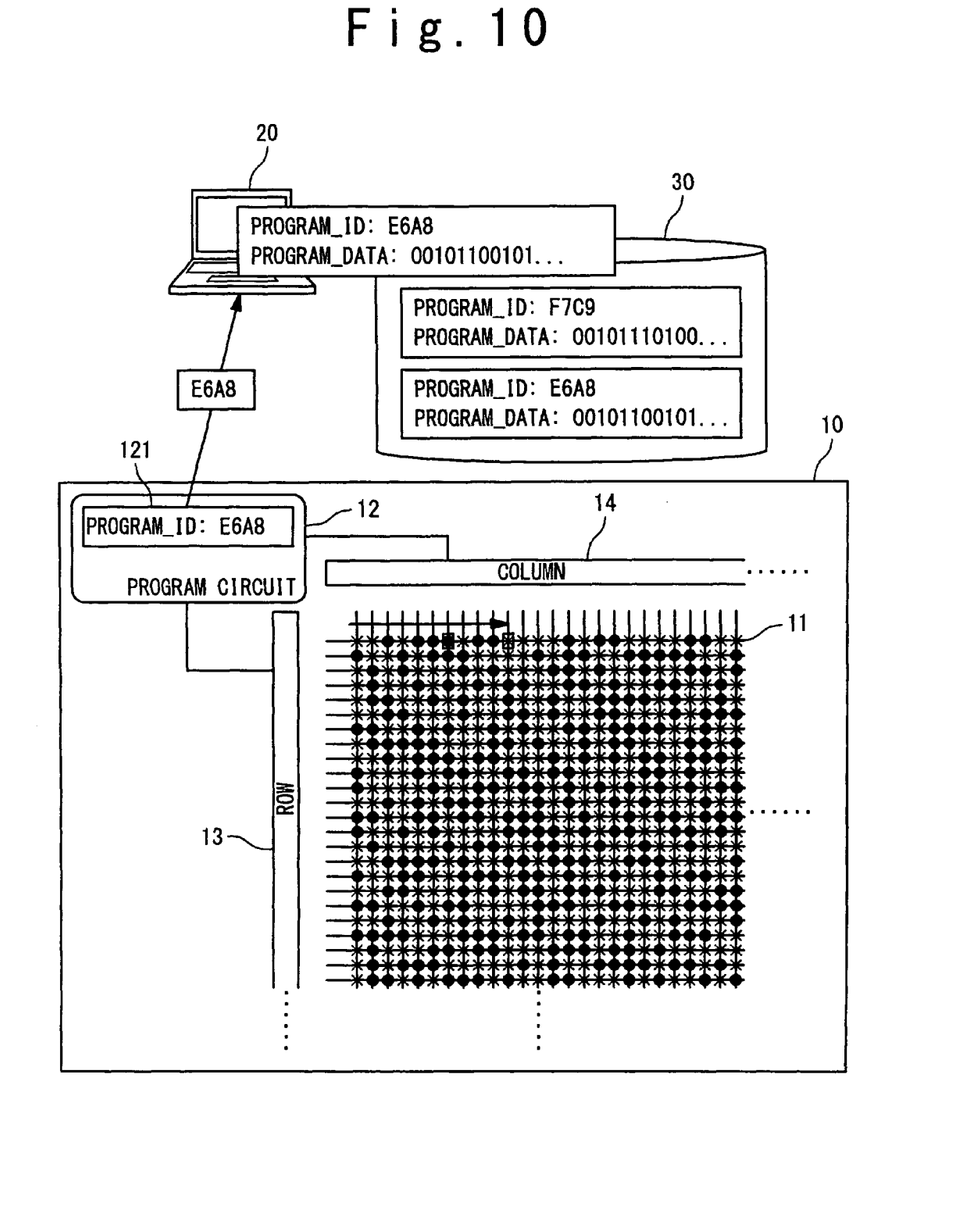
FIG. 10 is a diagram illustrating read of a PROGRAM_ID in the second or subsequent programming process.

As illustrated in FIG. 10, the host 20 reads a "PROGRAM_ID" from the PROGRAM_ID register 121 inside the device 10. That is, the host 20 inquires the "PROGRAM_ID" held in the PROGRAM_ID register 121 to the device 10. In this case, the device 10 returns "E6A8", which was first written, to the host 20.

(4) Step S204

On the basis of the "PROGRAM_ID" read from the PROGRAM_ID register 121 inside the device 10, the host 20 determines a state of the device 10. In this case, the host 20 determines that "the device 10 is not in an initial state", to read the "PROGRAM_DATA" corresponding to the read "PROGRAM_ID" from the database 30. In this case, the host 20 obtains the "PROGRAM_DATA" corresponding to "E6A8" from the database 30.

(5) Step S205

Figure 11:
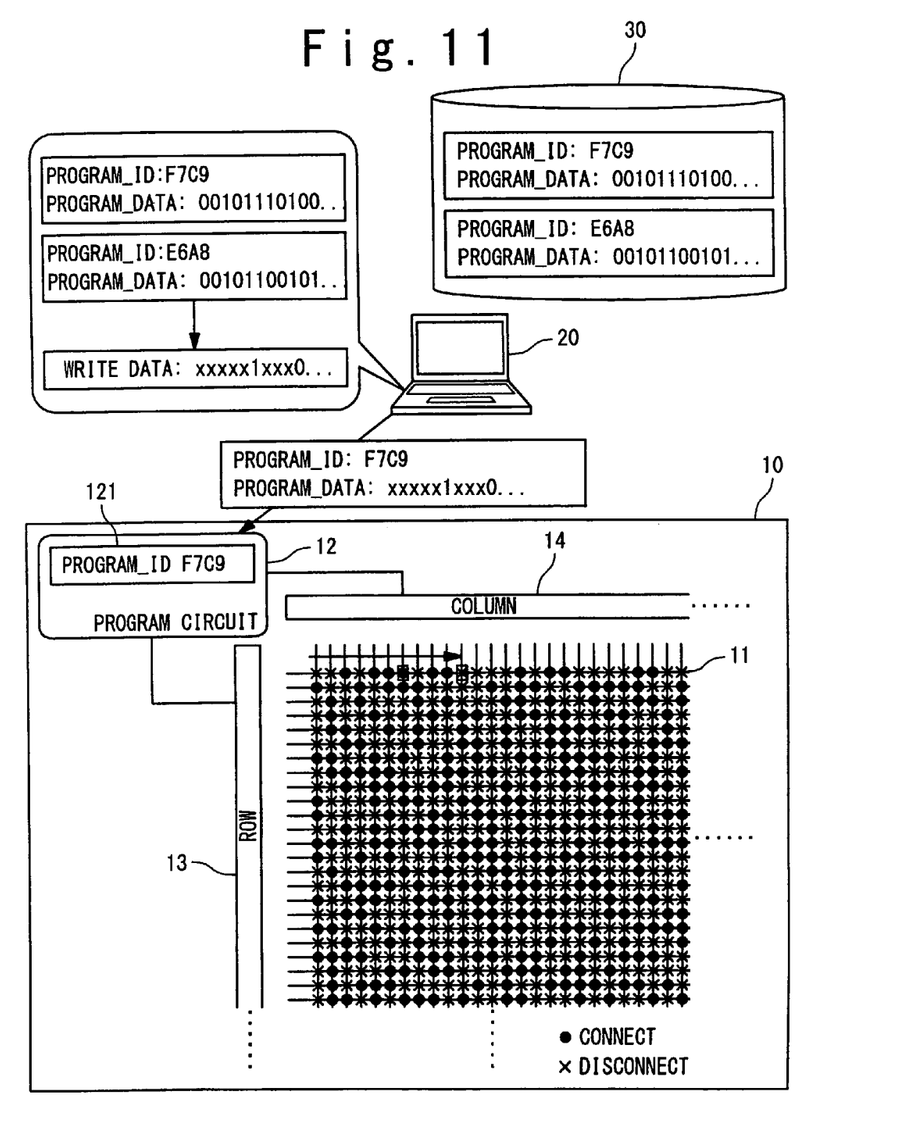
FIG. 11 is a diagram illustrating transfer of write DATA to the device in the second or subsequent programming process.

As illustrated in FIG. 11, the host 20 regards the "PROGRAM_DATA" (E6A8) obtained from the database 30 as current "DEVICE_DATA", and reads the "PROGRAM_DATA" corresponding to "PROGRAM_ID=F7C9" from the database 30. Here, the "PROGRAM_ID=F7C9" is given from a user. At this time, the host 20 replaces same data between the "PROGRAM_DATA" (F7C9) and the "PROGRAM_DATA" (E6A8) by "x=NO_OPERATION" to generate write DATA. It should be noted that the "PROGRAM_DATA" (E6A8) means the "PROGRAM_DATA" corresponding to "PROGRAM_ID=E6A8". Also, the "PROGRAM_DATA" (F7C9) means the "PROGRAM_DATA" corresponding to "PROGRAM_ID=F7C9".

(6) Step S206

The write DATA obtained in this way is transferred to the device 10.

(7) Step S207

The program circuit 12 of the device 10 performs any of the operations of "CONNECT", "DISCONNECT", and "NO_OPERATION" for each of the interconnections 11 based on the values of the write DATA. At this time, if "x=NO_OPERATION", the host 20 skips without doing anything.

(8) Step S208

Upon completion of the write operation of the write DATA, the host 20 writes the "PROGRAM_ID" in the PROGRAM_ID register 121 of the device 10. In this case, the host 20 transfers "F7C9" to the program circuit 12 of the device 10 as data of the "PROGRAM_ID". The program circuit 12 writes "F7C9, which is transferred from the host 20 and the data of the "PROGRAM_ID", in the PROGRAM_ID register 121.

In the above programming process, when the host 20 reads the "PROGRAM_ID" from the PROGRAM_ID register 121 inside the device 10, but cannot read the "PROGRAM_DATA" corresponding to the read "PROGRAM_ID" from the database 30, all the values of the "DEVICE_DATA" may be once set to "0" to proceed a first programming process. That is, if the "PROGRAM_DATA" is not detected, the host 20 may initialize the device 10 to perform the first programming process.

For example, when the "PROGRAM_DATA" is not detected, the host 20 transfers to the device 10, all of the values of the write DATA having "0=DISCONNECT", to write "PROGRAM_ID=0000" in the PROGRAM_ID register 121. Then, the host 20 proceeds the first programming process. The program circuit 12 of the device 10 controls the first and second logic circuits 13 and 14 to perform a "DISCONNECT" operation for each of the interconnections 11 based on the values of the write DATA, and writes "PROGRAM_ID=0000", which is notified from the host 20, in the PROGRAM_ID register 121. At this time, the host 20 preferably notifies the user that the "PROGRAM_DATA" is not detected.

Even if a "PROGRAM_ID" that is not registered in the database 30 is written in the PROGRAM_ID register 121 inside the device 10, the host 20 can ignore it and perform the first programming process. At this time, the host 20 may be adapted to initialize the device 10 to execute the first programming process as the process only when the "PROGRAM_DATA" corresponding to the "PROGRAM_ID" read from the PROGRAM_ID register 121 cannot be found from the database 30 through the search. Also, if the "PROGRAM_DATA" corresponding to the "PROGRAM_ID" read from the PROGRAM_ID register 121 cannot be found from the database 30 due to a communication failure or other reason, the host 20 may be adapted to output an error message indicating a failure in the search, to terminate the process. However, in practice, there is no limitation to such examples.

In addition, if a time necessary to connect/disconnect one of the interconnections 11 is 1 msec, and the number of interconnections is 1 M (million), an average programming time of a programmable device 10 can be estimated as follows:

Case of Using Present Invention

TABLE 1

| First process | 1M * 0.2 * 1 msec = 200 sec |
|---|---|
| Second or subsequent process | 1M * 0.006 * 1 msec = 6 sec |

Case of not Using Present Invention

TABLE 2

| First process | 1M * 0.2 * 1 msec = 200 sec |
|---|---|
| Second or subsequent process | 1M * 0.2 * 1 msec = 200 sec (+ initialization time) |

In the present invention, the difference is obtained upon programming of the device 10, and only portions having differences are programmed. In the present invention, a difference between second or subsequent program data (PROGRAM_DATA) and the previous data is small, ant therefore it can be expected that a second or subsequent write time is shortened.

Also, in the present invention, a state of the device 10, which underlies the generation of differential data, is automatically controlled, and therefore a user is not required to recognize the state of the device 10.

As described above, the present invention provides a resolution for a programming time in a highly integrated programmable device technique.

In the differential programmable device of the present invention, a difference between DEVICE_DATA indicating the states of interconnections (VIA) of the device to be programmed and PROGRAM_DATA is obtained, and only mismatched interconnections are programmed.

In the differential programmable device of the present invention, differential data is automatically generated by the host, and therefore the device is not required to incorporate a differential programming mechanism. The states of the interconnections of the device are accumulated in an external database. If a function of reading the interconnection states is attached to the device, there arises a problem in an integration degree or a security. Because the device is not required to incorporate the mechanism of reading the interconnection states, it is advantageous in security or integration degree if it is applied to a PLD device.

In the differential programmable device of the present invention, in order to relate the interconnection states of the device and data in the database to each other, the device may incorporate the PROGRAM_ID register. From the hardware perspective, only by adding the PROGRAM_ID register, the device can be applied to various programmable devices. Also, by using the database, a state of the device can be automatically controlled.

In the differential programmable device of the present invention, even if a mechanism of reading the interconnection states is assembled in the device as described above, a state of the device (mainly, interconnection states) can be recognized from the PROGRAM_ID embedded in the device and program data (PROGRAM_DATA) accumulated in the database.

Further, by combining the above features, a programming time can be shortened without controlling a state of the device. Specifically, in the differential programmable device of the present invention, a second or subsequent programming time can be considerably shortened. In particular, it is considered to be effective for prototyping, ECO, version up, or the like. Further, it is expected to be highly effective also in a dynamic programmable device.

As described above, the embodiment of the present invention has been described in detail; however, the present invention is not limited to the above-described embodiments in practice, and any modification without departing from the scope of the present invention is included in the present invention.

What is claimed is:

1. A programming system, comprising:
   a differential programming semiconductor device which comprises:
      a plurality of interconnections in which program data is programmed, and
      a program circuit which comprises an ID (identification) register configured to hold identification data corresponding to the programmed program data, and which programs the program data in said plurality of interconnections;
   a storage unit configured to store the program data; and
   a host configured to read first identification data corresponding to first program data from said ID register of said program circuit, read the first program data from said storage unit based on the first identification data, generate write data based on the first program data and a second program data, which is to be newly programmed in said plurality of interconnections, and transfer the write data to said program circuit,
   wherein the first program data has been programmed in said plurality of interconnections, and
   wherein said program circuit writes the write data in said plurality of interconnections to program the second program data in said plurality of interconnections.

2. The programming system according to claim 1, wherein said host transfers a second identification data corresponding to the second program data to said program circuit, and said program circuit sets the second identification data in said ID register.

3. The programming system according to claim 2, wherein said host stores a set of the second identification data and the second program data in said storage unit.

4. The programming system according to claim 1, wherein the first identification data set in said ID register takes a specific data when said plurality of interconnections are in an initial state in which no program data is programmed.

5. The programming system according to claim 4, wherein said host generates the second program data as the write data, when the first identification data takes the specific data.

6. The programming system according to claim 1, wherein said host generates the write data such that when data of an element of the first program data and data of an element of the second program data which corresponds to the element of the first program data are same, data of an element of the write data which corresponds to the element of the first program data indicates no-operation.

7. The programming system according to claim 6, wherein said host generates the write data such that when the data of the element of the first program data and data of the corresponding element of the second program data are different, the data of the corresponding element of the write data indicates the data of the corresponding element of the second program data.

8. The programming system according to claim 1, wherein said host generates the write data such that the second program data is set as the write data, when the first program data cannot be read out from said storage unit.

9. A semiconductor device, which functions as a differential programmable device, comprising:
   a plurality of interconnections, each of which is set to a connection state or a disconnection state;
   a program circuit which comprises an ID identification register configured to hold program identification data of program data programmed in said plurality of interconnections, and which receives the program data and programs said plurality of interconnections based on the received program data; and
   a host configured to read the identification data corresponding to the programmed program data from the ID register, read the program data based on the identification data, generate write data based on at least in part the program data, and transfer the write data to the program circuit,
   wherein the program circuit programs the plurality of interconnections from the program data comprising a first program data and a second program data to generate the write data comprising a plurality of elements, and
   wherein each of the elements of the write data indicates any of connection, disconnection and no-operation, and said program circuit programs said plurality of interconnections based on the elements of the write data.

10. The semiconductor device according to claim 9, wherein the first program data has been programmed in said plurality of interconnections.

11. The semiconductor device according to claim 9, wherein the second program data is to be newly programmed in the plurality of interconnections.

* * * * *